Oct. 9, 1962 K. HINRICHS ET AL 3,058,068

CLAMPING CIRCUIT FOR FEEDBACK AMPLIFIERS

Filed Aug. 11, 1958

INVENTORS.
KARL HINRICHS
JEROME V. WHITE

BY THEIR ATTORNEYS.
HARRIS, KIECH, FOSTER & HARRIS

United States Patent Office 3,058,068

Patented Oct. 9, 1962

3,058,068

CLAMPING CIRCUIT FOR FEEDBACK AMPLIFIERS

Karl Hinrichs, Anaheim, and Jerome V. White, Whittier, Calif., assignors to Beckman Instruments, Inc., a corporation of California Filed Aug. 11, 1958, Ser. No. 754,328
8 Claims. (Cl. 330—10)

Figure 1:
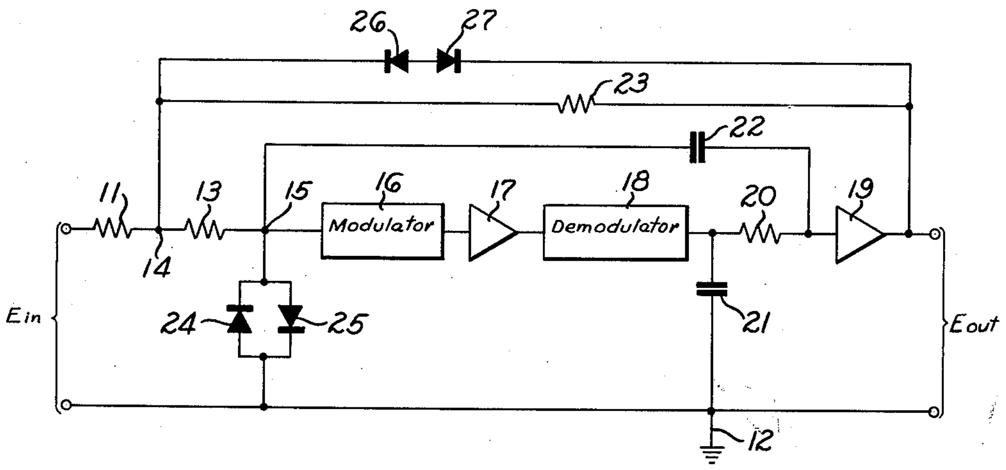

This invention relates to clamping circuits for use with feedback amplifiers. There are two general methods of connection of feedback amplifiers, operational and potentiometric. In an operational feedback connection, the over-all gain of the amplifier is determined by the ratio of the feedback impedance placed in parallel with the amplifier and the impedance placed in series with the amplifier and connected to the junction of the feedback impedance. In a potentiometric feedback connection, the output is connected across a potentiometric divider with an input lead connected to an intermediate point on the divider. Potentiometric type amplifiers may have extremely high input impedances while operational type amplifiers have an input impedance substantially equal to that of the input resistor. An important object of the invention is to provide feedback amplifier clamping circuits which may be used equally well with potentiometric and operational type amplifiers.

In a feedback amplifier, the voltage actually amplified is the difference between the incoming signal voltage and a portion of the output voltage known as the feedback voltage. This difference is known as the error voltage. The feedback voltage is added to the incoming signal at a summing node with the feedback voltage being of the opposite polarity to provide the desired difference signal. Under steady state conditions, the error voltage at the summing node is very close to zero and is an inverse function of the loop gain of the amplifier. Then the current from the summing node to the amplifier is very small and the active elements of the amplifier operate far from their saturation points, permitting a linear response in the system.

However, because of time constants in the forward and/or feedback paths, rapid changes in the incoming signal, such as step inputs produced by successive sampling of a plurality of sources of a data handling system, will create large error voltages resulting in considerable currents from the summing node to the amplifier. This produces saturation, nonlinear response, slow recovery to equilibrium and excessive output voltage. Such temporarily high output voltages operating in conjunction with low output impedances may damage the load connected to the amplifier and the amplifier itself. Accordingly, it is an object of the invention to provide a feedback amplifier circuit having means for preventing excessive output voltages without disturbing the desirable high gain, fast response characteristics of the amplifier. A further object of the invention is to provide a feedback amplifier circuit which is always operated within its linear response range without the possibility of saturation regardless of the magnitude and wave form of the incoming signal.

It is an object of the invention to provide a clamping circuit for a feedback amplifier wherein the magnitude of the output voltage is limited without disturbing the desirable operating characteristics of the amplifier. A further object is to provide such a circuit wherein the error voltage to the amplifier is similarly limited. Another object of the invention is to provide such a clamping circuit which is suitable for use with amplifiers having a single forward and a single feedback path as well as those having parallel loops.

It is an object of the invention to provide a feedback amplifier circuit having an input voltage clamp for limiting the input voltage to the amplifier to predetermined small magnitudes of either polarity and a feedback voltage clamp for limiting the magnitude of the output voltage coupled to the summing node to predetermined magnitudes of either polarity. A further object of the invention is to provide such a circuit wherein the input voltage clamp comprises a dropping resistor in series with parallel connected rectifier units of opposing polarities. A further object of the invention is to provide such a circuit wherein the feedback voltage clamp includes a pair of rectifiers of the zener type connected in series in opposing polarity across the feedback impedance.

The invention also comprises novel details of construction and novel combinations and arrangements of parts, together with other objects, advantages, features and results, which will more fully appear in the course of the following description. The drawing merely shows and the description merely describes embodiments of the present invention which are given by way of illustration or example.

Figure 2:
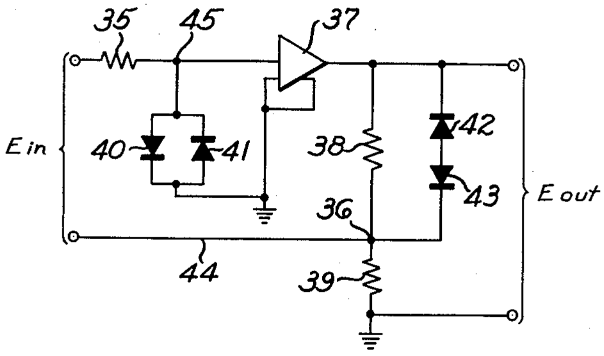

In the drawing:

FIG. 1 is a schematic diagram of the clamping circuit of the invention as applied to an operational type feedback amplifier; and FIG. 2 is a schematic diagram of the clamping circuit of the invention as applied to a potentiometric type feedback amplifier.

FIG. 1 shows a parallel-loop type D.C. amplifier connected in an operational manner. The input voltage is applied between an input resistor 11 and circuit ground 12. The input resistor 11 is connected to a dropping resistor 13 at a summing node 14 with the dropping resistor connected to a D.C. amplifier at a junction point 15, the D.C. amplifier consisting of a modulator 16, an amplifier 17 and a demodulator 18. The demodulator 18 is connected to a power amplifier 19 by a resistor 20, with the amplifier 19 producing the output voltage for the circuit. A filter capacitor 21 is connected between the output of the demodulator 18 and circuit ground. A capacitor 22 is connected between the junction point 15 and the input to the power amplifier 19. A feedback resistor 23 is connected between the output of the amplifier 19 and the summing node 14.

Rectifiers 24, 25 are connected in parallel in opposing polarities between the junction point 15 and circuit ground. Rectifiers 26 and 27 are connected in series in opposing polarities across the feedback resistor 23. The rectifiers 26 and 27 have particular characteristics which will be described hereinbelow.

As in conventional feedback amplifiers, the voltage applied to the summing node 14 through the feedback resistor 23 is opposite in polarity to the input voltage applied through the resistor 11. Under steady state conditions, the voltage at the summing node 14 will be substantially the circuit ground voltage because of the high loop gain of the circuit.

The series group consisting of the modulator 16, amplifier 17 and demodulator 18 provides a direct current forward signal path in the circuit. The capacitor 22 provides a forward signal path for high frequencies, such as step changes in the input signal, providing rapid response to such step changes. The characteristics of the D.C. path are such that the time constant of the filter on the output of the demodulator is required to be very large. This is true in any type of D.C. amplifier that uses a modulator, with or without a parallel high-frequency path.

Now consider the operation of the circuit of FIG. 1 without the rectifiers 24, 25, 26, and 27. If a step of voltage is applied, there will be some time lag before the amplifier output voltage can change to supply the required feedback voltage. During this period a large portion of the entire signal voltage exists at the summing node 14, which normally has only a fraction of a microvolt applied. This large voltage can saturate amplifier 19, and will charge the capacitor 21. Even though the long time constant means that the capacitor 21 charges slowly, the input voltage is so large that the total charge may be many times larger than normal before the amplifier output voltage has changed enough to produce sufficient feedback to reduce the error voltage to near zero. This may result in unstable conditions in the whole amplifier circuit since the excessive charge on the capacitor can only be removed slowly due to the long time constant of the filter. Furthermore, because of the large error signal, or during recovery from transient loading or saturation, the output of the amplifier 19 may exceed the safe limits of the load or of the amplifier itself causing damage to the components.

These undesirable effects are eliminated by the clamping circuit of the invention. An input voltage clamp comprising the dropping resistor 13 and the rectifiers 24, 25 is connected between the summing node 14 and circuit ground. When the voltage at the junction point 15 exceeds a predetermined value of either polarity which is determined by the characteristics of the particular rectifier utilized, one of the rectifiers 24, 25, will begin to conduct and effectively shunt the signal to ground, thereby preventing large excursions from zero voltage at the input to the modulator 16.

A feedback voltage clamp consisting of the rectifiers 26 and 27 is connected across the feedback resistor 23. The rectifiers 26 and 27 are of the zener type, preferably being zener crystal diodes. A zener rectifier acts as a normal rectifier in that it provides a low impedance path in one direction and a high impedance path in the opposite direction. However, the high impedance path is maintained only as long as the applied voltage is lower than a specific value, called the zener voltage. When the applied back voltage exceeds the zener voltage, a zener rectifier will also conduct in the rearward direction. Therefore, with two zener rectifiers connected in series in opposing polarities, the combination will be an open circuit for low voltages of either polarity and will provide a low impedance path for high voltages of either polarity. Since the zener diodes comprising the feedback clamp are in parallel with the feedback resistor 23, a decrease in their impedance reduces the gain of the amplifier, limiting the output voltage of the amplifier. Since the clamping circuits of the invention do not produce limiting or saturation in the amplifiers themselves, the circuit is in equilibrium immediately upon restoration of normal operating conditions. Thus it is seen that the clamping circuits of the invention provide the desired output limiting and fast recovery time without adversely affecting the linearity, high gain and fast response of the feedback amplifiers.

The function of the two clamping circuits is not identical, but in certain respects complementary. For steadily high input voltages, the error signal will eventually become substantially zero, such that the input clamp does not operate after a transient period during which the feedback signal may not yet be equal and opposite in sign to the input village. However, under such circumstances the output or feedback clamp would permanently reduce the amplifier gain, because of the low impedance path then provided by the zener diodes. On the other hand, in case of a stop in voltage the zener diodes may be for a short time equivalent to an open circuit, or even never operate at all, so that the input voltage clamp is then the only device which prevents harmful effects to the amplifier.

It should be noted that the clamping circuits of FIG. 1 are equally applicable to operational amplifiers which do not utilize parallel loops. For example, the capacitor 22 and/or the amplifier 19 may be omitted in certain applications of the operational amplifier without affecting the invention.

The clamping circuits of the invention are equally applicable to potentiometric type feedback amplifiers, as shown in FIG. 2. Therein, the incoming signal is applied between a limiting resistor 35 and a junction point 36. The limiting resistor 35 is connected to an amplifier 37 at a junction 45, and the output of the amplifier, which constitutes the output of the circuit, is developed across resistors 38, 39. Rectifiers 40 and 41 are connected in parallel in opposing polarity between the junction 45 and circuit ground. Rectifiers 42 and 43, which are of the zener type, are connected in series in opposing polarity across the resistor 38. In the potentiometric type of amplifier, resistors 38 and 39 function as a potentiometer across the amplifier output. The feedback voltage is developed across the resistor 39 and is fed back to the input via lead 44. The resistor 35 and the rectifiers 40, 41 function as the input voltage clamp in the same manner as the recorder 13 and rectifiers 24, 25 of FIG. 1. The zener rectifiers 42 and 43 function as the feedback voltage clamp. When the voltage across resistor 38 tends to exceed the zener breakdown voltage of the diodes 42, 43, they become a low impedance. A larger proportion of the output is now developed across resistor 39 and fed back, thereby reducing the gain of the amplifier. Under steady state conditions, the error voltage at the amplifier input 45 is very close to circuit ground. However, the same situations as evolved in FIG. 1 may arise. For example, since there is always some time between application of an input and development of the corresponding output, the voltage fed back from the output will not always be equal and opposite to the incoming signal when rapid changes of input occur. This can result in large error voltages and excessive output voltage. These undesirable conditions are prevented as in the operational type of amplifier connection by the clamping circuits as described above.

Although exemplary embodiments of the invention have been disclosed and discussed, it will be understood that other applications of the invention are possible and that the embodiment disclosed may be subjected to various changes, modifications and substitutions without necessarily departing from the spirit of the invention.

We claim as our invention:

1. In a feedback amplifier circuit, the combination of: amplifier means having an input and an output; an error voltage connected to said input; means including a feedback impedance for feeding back at least a portion of the voltage at said output; means for adding the incoming signal voltage and said fed back portion of the output voltage in opposition to produce said error voltage; means for maintaining said error voltage close to zero comprising a first voltage clamp connected across said input; and means for reducing the magnitude of either polarity of said fed back portion of the output voltage comprising a second voltage clamp connected in parallel with at least a portion of said feedback impedance.

2. In a feedback amplifier circuit, the combination of: amplifier means having an input and an output; an error voltage connected to said input; means including a feedback impedance for feeding back at least a portion of the voltage at said output; means for adding the incoming signal voltage and said fed back portion of the output voltage in opposition to produce said error voltage; means for maintaining said error voltage close to zero comprising a first voltage clamp connected across said input, said first voltage clamp including a dropping impedance in series with two rectifier units, with said rectifier units connected in parallel in opposing polarities; and means for reducing the magnitude of either polarity of said fed back portion of the output voltage comprising a second voltage clamp connected in parallel with at least a portion of said feedback impedance, said second voltage clamp including two rectifier units of the zener type connected in series in opposing polarities.

3. In a feedback amplifier circuit, the combination of: amplifier means having an input and an output; a feedback loop including a feedback resistor for coupling at least a portion of the output voltage of said amplifier means to said input thereof in opposition to the incoming signal at said input; and a pair of zener type rectifiers connected in series in opposing polarities, with said pair of rectifiers connected across said feedback resistor.

4. In a feedback amplifier circuit of the potentiometric type having first and second input terminals and first and second output terminals, the combination of: a dropping resistor connected between said first input terminal and a junction point; amplifier means connected between said junction point and said first output terminal, with the output of said amplifier developed across said output terminals; an input voltage clamp comprising a pair of rectifiers connected in parallel in opposite polarities between said junction point and said second output terminal; a first output divider resistor connected between said first output terminal and said second input terminal; a second output divider resistor connected between said second input terminal and said second output terminal; and a feedback voltage clamp comprising a pair of zener type rectifiers connected in series in opposing polarities across said first divider resistor.

5. In a feedback amplifier circuit of the operational type having first and second input terminals and first and second output terminals, with said second input and output terminals connected together, the combination of: a dropping resistor connected between said first input terminal and a junction point; amplifier means connected between said junction point and said first output terminal, with the output of said amplifier developed across said output terminals; an input voltage clamp comprising a pair of rectifiers connected in parallel in opposing polarities between said junction point and said second output terminal; a feedback resistor connected between said first output terminal and said first input terminal; and a feedback voltage clamp comprising a pair of zener type rectifiers connected in series in opposing polarities across said feedback resistor.

6. In a feedback amplifier circuit of the operational type having first and second input terminals and first and second output terminals, with said second input and output terminals connected together, the combination of: a dropping resistor connected between said first input terminal and a first junction point; first amplifier means connected between said first junction point and a second junction point; second amplifier means connected between said second junction point and said first output terminal, with the output of said amplifier developed across said output terminals; an input voltage clamp comprising a pair of rectifiers connected in parallel in opposing polarities between said first junction point and said second output terminal; a feed forward capacitor connected between said first and second junction points; a feedback resistor connected between said first output terminal and said first input terminal; and a feedback voltage clamp comprising a pair of zener type rectifiers connected in series in opposing polarities across said feedback resistor.

7. In a potentiometric feedback amplifier circuit for generating an output voltage in response to an input voltage, the combination of: an amplifier having a pair of input terminals and a pair of output terminals, with one terminal of each pair connected to a common circuit ground whereby the output voltage is generated across the other of said output terminals and circuit ground; a potential divider including a first impedance connected between said other output terminal and a second impedance; means for applying the input voltage in series with said second impedance across said other input terminal and said circuit ground; means for limiting the input signal applied to said amplifier comprising a first bipolar voltage limiting device connected between said other input terminal and said circuit ground; and means responsive to high output voltages for decreasing the gain of said amplifier and thereby reducing the output voltage thereof comprising a second bipolar voltage limiting device having zener type characteristics to effect non-destructive breakdown from a very high resistance to a very low resistance at a predetermined voltage level connected to opposite terminals of said first impedance.

8. In a potentiometric feedback amplifier circuit, the combination of: an amplifier with high negative gain and having a pair of input terminals and a pair of output terminals, with one terminal of each pair connected to a common circuit ground; a voltage dividing network connected between the other output terminal and said common circuit ground, said network having a tap terminal; means for connecting a voltage to be amplified between said tap and other input terminal, whereby said other input terminal is at a normally low error voltage with respect to said circuit ground; means for limiting the input signal applied to said amplifier comprising a first bipolar voltage clamping means connected between said other input terminal and said circuit ground so that said error voltage remains low regardless of magnitude variations of said voltage to be amplified; and means responsive to high output voltages for decreasing the gain of said amplifier and thereby reducing the output voltage thereof comprising a second bipolar voltage limiting device having zener type characteristics to effect non-destructive breakdown from a very high resistance to a very low resistance at a predetermined voltage level connected to said tap terminal and to the ungrounded output terminal.

References Cited in the file of this patent

UNITED STATES PATENTS

| | | |
|---|---|---|
| 2,066,333 | Caruthers | Jan. 5, 1937 |
| 2,137,401 | Hobbie | Nov. 22, 1938 |
| 2,547,703 | Hermont | Apr. 3, 1951 |
| 2,557,888 | Olson | June 19, 1951 |
| 2,681,989 | Cunniff | June 22, 1954 |
| 2,715,660 | Colchester | Aug. 16, 1955 |
| 2,861,239 | Gilbert | Nov. 18, 1958 |
| 2,877,348 | Wade | Mar. 10, 1959 |

FOREIGN PATENTS

| | | |
|---|---|---|
| 516,250 | Great Britain | Dec. 18, 1939 |
| 245,231 | Switzerland | July 1, 1947 |
| 846,560 | Germany | Aug. 14, 1952 |
| 896,068 | Germany | Nov. 9, 1953 |
| 760,257 | Great Britain | Oct. 31, 1956 |